(12) United States Patent
de Ridder

(10) Patent No.: US 12,410,518 B2
(45) Date of Patent: Sep. 9, 2025

(54) INJECTOR CONFIGURED FOR ARRANGEMENT WITHIN A REACTOR OF A VERTICAL FURNACE AND VERTICAL FURNACE

(71) Applicant: ASM IP Holding B.V., Almere (NL)

(72) Inventor: Christianus G. M. de Ridder, Hoogland (NL)

(73) Assignee: ASM IP Holding B.V., Almere (NL)

( * ) Notice: Subject to any disclaimer, the term of this patent is extended or adjusted under 35 U.S.C. 154(b) by 460 days.

(21) Appl. No.: 17/230,047

(22) Filed: Apr. 14, 2021

(65) Prior Publication Data

US 2021/0324518 A1  Oct. 21, 2021

Related U.S. Application Data

(60) Provisional application No. 63/011,536, filed on Apr. 17, 2020.

(51) Int. Cl.
| | |
|---|---|
| *C23C 16/455* | (2006.01) |
| *C23C 16/458* | (2006.01) |
| *F27B 1/10* | (2006.01) |
| *F27B 5/02* | (2006.01) |
| *F27B 17/02* | (2006.01) |
| *F27D 1/00* | (2006.01) |
| *F27D 1/18* | (2006.01) |
| *F27D 3/00* | (2006.01) |
| *H01L 21/67* | (2006.01) |
| *H01L 21/673* | (2006.01) |

(52) U.S. Cl.
CPC .... *C23C 16/45578* (2013.01); *C23C 16/4582* (2013.01); *F27B 1/10* (2013.01); *F27B 5/02* (2013.01); *F27B 17/02* (2013.01); *F27D 1/0033* (2013.01); *F27D 1/1858* (2013.01); *F27D 3/0084* (2013.01); *H01L 21/67109* (2013.01); *H01L 21/6732* (2013.01)

(58) Field of Classification Search
CPC . C23C 16/45578; C23C 16/4582; F27B 1/10; F27B 5/02; F27D 1/0033; F27D 1/1858; F27D 3/0084; H01L 21/67109; H01L 21/6732

See application file for complete search history.

(56) References Cited

U.S. PATENT DOCUMENTS

| | | | | |
|---|---|---|---|---|
| 1,971,376 A | * | 8/1934 | Hunt | B22C 23/02 |
| | | | | 118/308 |
| 5,704,981 A | * | 1/1998 | Kawakami | C23C 16/455 |
| | | | | 118/725 |

(Continued)

FOREIGN PATENT DOCUMENTS

| | | |
|---|---|---|
| JP | H0997768 A | 4/1997 |
| JP | H11195611 A | 7/1999 |

*Primary Examiner* — Charlee J. C. Bennett
(74) *Attorney, Agent, or Firm* — Snell & Wilmer L.L.P.

(57) ABSTRACT

An injector configured for arrangement within a reactor of a vertical furnace to inject gas in the reactor is provided. The injector is made substantial elongated and configured with an internal gas conduction channel to transport gas from a first end of the injector to a second end of the injector. An outer sidewall of the injector may be tapered towards the second end over at least 10%, preferably 30% and most preferably 50% of the length of the injector to increase tolerances for fitting the injector in the tube.

19 Claims, 3 Drawing Sheets

(56) References Cited

U.S. PATENT DOCUMENTS

| | | | |
|---|---|---|---|
| 5,850,841 A * | 12/1998 | Han | H01L 21/67051 |
| | | | 134/198 |
| 6,488,775 B2 | 12/2002 | Shimizu | |
| 6,916,400 B2 * | 7/2005 | Moisan | B01J 19/088 |
| | | | 118/723 MR |
| 8,298,386 B2 * | 10/2012 | Wang | C23C 14/34 |
| | | | 156/345.33 |
| 2001/0025605 A1 * | 10/2001 | Nagakura | C23C 16/45563 |
| | | | 118/715 |
| 2001/0052556 A1 | 12/2001 | Ting et al. | |
| 2014/0030433 A1 * | 1/2014 | Ranish | C23C 16/24 |
| | | | 118/728 |
| 2014/0273409 A1 * | 9/2014 | Pitney | C23C 16/45587 |
| | | | 118/715 |
| 2016/0168704 A1 * | 6/2016 | Choi | C23C 16/45546 |
| | | | 156/345.33 |
| 2017/0232457 A1 * | 8/2017 | Fujino | C23C 16/45578 |
| | | | 118/724 |
| 2018/0274094 A1 * | 9/2018 | Ikeda | H01L 21/0228 |
| 2019/0032998 A1 * | 1/2019 | Jdira | F27D 3/0084 |
| 2019/0330740 A1 * | 10/2019 | Klaver | C23C 16/4557 |

\* cited by examiner

INJECTOR CONFIGURED FOR ARRANGEMENT WITHIN A REACTOR OF A VERTICAL FURNACE AND VERTICAL FURNACE

CROSS-REFERENCE TO RELATED APPLICATIONS

This application claims priority to U.S. Provisional Patent Application Ser. No. 63/011,536 filed Apr. 17, 2020 titled INJECTOR CONFIGURED FOR ARRANGEMENT WITHIN A REACTOR OF A VERTICAL FURNACE AND VERTICAL FURNACE, the disclosure of which is hereby incorporated by reference in its entirety.

FIELD

The present disclosure relates to an injector configured for arrangement within a reactor of a vertical furnace. Injectors may inject gas in the reactor. The injector may be elongated and configured with an internal gas conduction channel to transport gas from a first end of the injector to a second end of the injector.

BACKGROUND

A vertical processing furnace for processing substrates, e.g., semiconductor wafers, may include a vertically oriented process tube forming the reactor. The upper end of the process tube may be closed, for example by a dome-shaped structure, whereas the lower end of the process tube may be open. A closeable door may close the lower end. A reaction chamber bounded by the tube and the door may form a reaction chamber in which wafers to be treated may be processed. The wafers may be loaded to a wafer boat which may be placed on the door that is vertically moveably arranged and that may be configured to close off the opening of the process tube. A heater may be configured around the process tube to heat the reaction chamber.

The injector may be provided in the reaction chamber. The injector may be supported at a first end near the lower end near the opening of the processing tube. The injector may be directed with its elongated shape extending along the vertical direction in the small space between the process tube (or a liner provided to the tube) and the wafer boat into the process chamber.

To increase productivity, the number of wafers in the reaction chamber may increase. The process tube and the injector may therefore become longer. Since the injector may only be supported at a first end, it may be difficult to control the position of the (other) second end of the injector in the small space between the process tube and the wafer boat in the reaction chamber. The small space may even become smaller when a liner is provided along the inside surface of the process tube which may make the tolerance at which the injector may be fitted even more tight.

SUMMARY

An improved injector may be required which may be more easily fitted in the small space between the process tube (or a liner provided to the tube) and the wafer boat in the reaction chamber.

Accordingly, there may be provided an injector configured for arrangement within a reactor of a vertical furnace to inject gas in the reactor. The injector may be substantially elongated and configured with an internal gas conduction channel to transport gas from a first end of the injector to a second end of the injector. An outer side wall of the injector may be tapered towards the second end of the injector over at least 10%, preferably 30%, more preferably 50%, and even more preferable over 100% of its length of its length.

Since the injector is tapered over at least 10%, preferably 30%, more preferably 50%, and even more preferable over 100% of its length near the second end, it may occupy less space in the small space between the process tube (or a liner provided to the tube) and the wafer boat in the reaction chamber where the tolerances are the most tight, i.e., at the second end of the injector. The tolerances at which the injector with its tapered second end may be positioned in the small space may therefore be more relaxed.

According to an embodiment there may be provided a vertical furnace comprising: a process tube provided with an opening with a closeable door to form a reaction chamber; a heater configured to heat the reaction chamber of the process tube; and a wafer boat that is configured to move substrates in the reaction chamber in a vertical direction. An injector may be provided in the reaction chamber. The injector may be supported at its first end near the opening and may be directed with its elongated tapered second end extending along the vertical direction into the reactions chamber.

The various embodiments of the invention may be applied separate from each other or may be combined. Embodiments of the invention will be further elucidated in the detailed description with reference to some examples shown in the figures.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

In this application similar or corresponding features are denoted by similar or corresponding reference signs. The description of the various embodiments is not limited to the examples shown in the figures and the reference number used in the detailed description and the claims are not intended to limit what is described to the examples shown in the figures.

Figure 1:
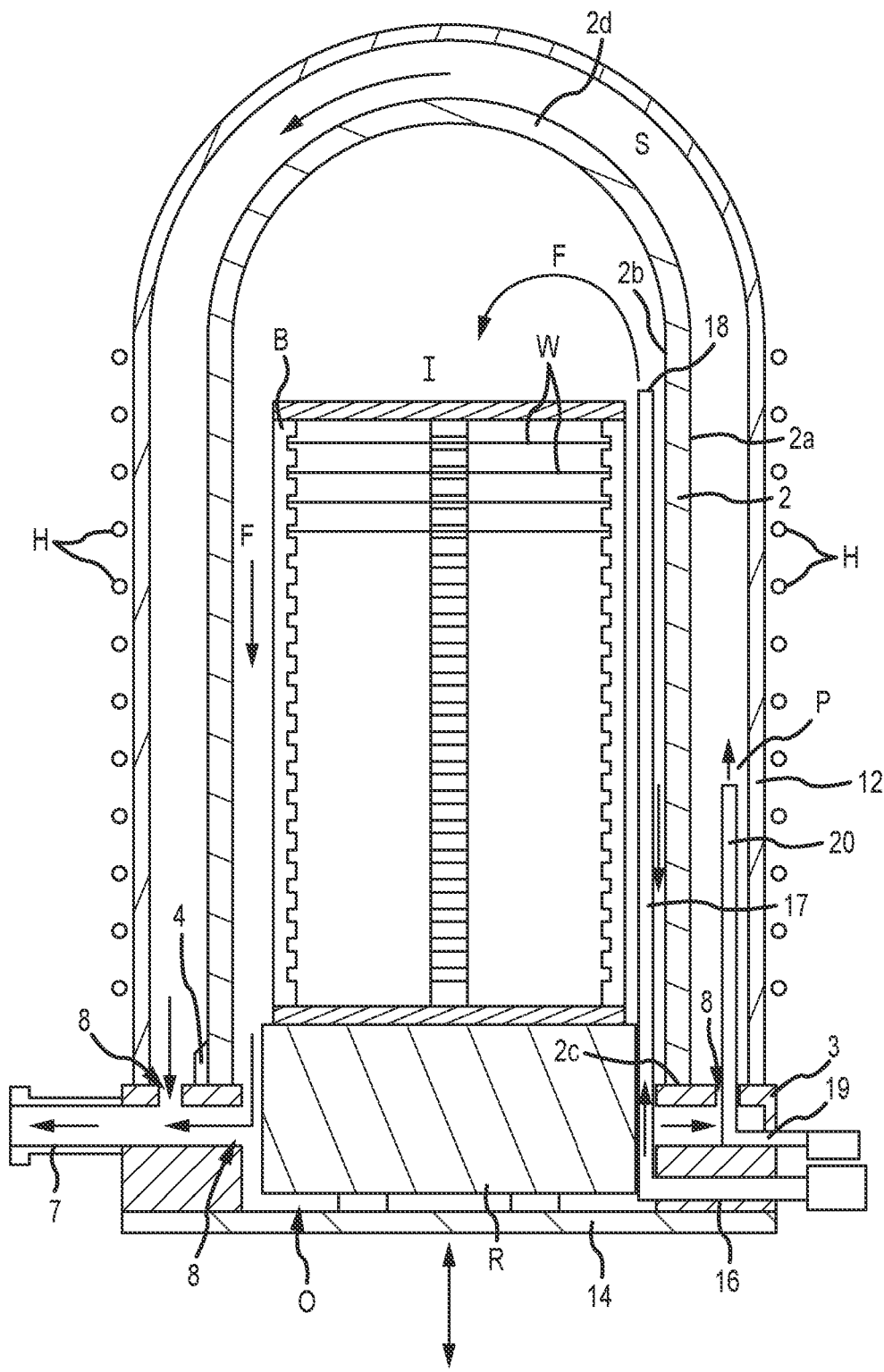
FIG. 1 shows a cross-sectional view of a tube of a vertical furnace including an injector.

FIG. 1 shows a cross-sectional view of a vertical furnace. The vertical furnace may comprises a process tube 12 forming a reaction chamber and a heater H configured to heat the reaction chamber. A liner 2 may be provided along the process tube 12, the liner 2 may comprise a substantially cylindrical wall delimited by a liner opening at a lower end and a dome shape top closure 2d at the higher end.

A flange 3 may be provided to at least partially close the opening of the process tube 12. A vertically movably arranged door 14 may be configured to close off a central inlet opening O in the flange 3 and may be configured to support a wafer boat B that is configured to hold substrates W. The door 14 may be provided with a pedestal R. The pedestal R may be rotated to have the wafer boat B in the reaction chamber rotating.

In the example shown in FIG. 1, the liner 2 may comprise a substantial cylindrical liner wall having an outer substantial cylindrical surface 2a and an inner substantial cylindrical surface 2b. The flange 3 may be configured to at least partially close the tube opening and the liner opening defined more precisely by the lower end surface 2c of the liner 2. The flange 3 comprises:

an inlet opening O configured to insert and remove the boat B configured to carry substrates W in the reaction chamber I of the liner 2;

a gas inlet 16 to provide a gas F, for example a reaction gas to the reaction chamber I; and, a gas exhaust duct 7 to remove gas from the reaction chamber I.

The gas inlet 16 may be operably connected to an elongated injector 17 constructed and arranged to extend vertically into the reaction chamber I along the substantial cylindrical wall of the liner 2 towards the higher second end. The injector may be supported by the flange 3 at a first end of the injector and may comprising an injector opening to inject gas in the reaction chamber.

Gas exhaust openings 8 connected to the gas exhaust duct 7 for removing gas from the reaction chamber I may be constructed and arranged below the injector opening 18. In this way a down flow F in the reaction chamber of the liner 2 may be created. This down flow F may transport contamination of reaction byproducts and particles from the substrate W, the boat B, the liner 2 and/or the support flange 3 downward to the exhaust openings 8 away from the processed substrates W.

The gas exhaust opening 8 for removing gas from the reaction chamber I may be provided below the open end of the liner 2. This may be beneficial since a source of contamination of the process chamber may be formed by the contact between the liner 2 and the flange 3. Again, the down flow F may transport the particles from the liner-flange interface downward to the exhaust away from the processed substrates.

The gas exhaust openings 8 may be constructed and arranged in the flange 3 between the liner 2 and the tube 12 for removing gas from the circumferential space between the liner 2 and the tube 12. In this way the pressure in the circumferential space and the interior space I may be made equal and in a low-pressure vertical furnace may be made lower than the surrounding atmospheric pressure surrounding the tube 12. The vertical furnace may be provided with a pressure control system to remove gas from the reaction chamber.

In this way the liner 2 may be made rather thin and of a relatively weak material since it doesn't have to compensate for atmospheric pressure. This creates a larger freedom in choosing the material for the liner 2. The thermal expansion of the material of liner 2 may be chosen such that it may be comparable with the material deposited on the substrate in the reaction chamber. The latter having the advantage that the expansion of the liner and the material deposited also on the liner may be the same. The latter minimizes the risk of the deposited material dropping of as a result of temperature changes of the liner 2.

The tube 12 may be made rather thick and of a relatively strong compressive strength material since it may have to compensate for atmospheric pressure with respect to the low pressure on the inside of the tube. For example, the low pressure process tube 12 can be made of 5 to 8, preferably around 6 mm thick Quartz. Quartz has a very low Coefficient of Thermal Expansion (CTE) of $0.59 \times 10\text{-}6$ K-1 (see table 1) which makes it more easy to cope with thermal fluctuations in the apparatus. Although the CTE of the deposited materials may be higher (e.g., CTE of Si3N4=$3 \times 10\text{-}6$ K-1, CTE of Si=$2.3 \times 10\text{-}6$ K-1) the differences may be relatively small. When films are deposited onto tube made of quartz, they may adhere even when the tube goes through many large thermal cycles however the risk of contamination may be increasing.

The liner 2 may circumvent any deposition on the inside of the tube 2 and therefore the risk of deposition on the tube 12 dropping off may be alleviated. The tube may therefore be made from Quartz.

A liner 2 of silicon carbide (CTE of SiC=$4 \times 10\text{-}6$ K-1) may provide an even better match in CTE between deposited film and liner, resulting in a greater cumulative thickness before removal of the deposited film from the liner may be required. Mismatches in CTE result in cracking of the deposited film and flaking off, and correspondingly high particle counts, which is undesirable and may be alleviated by using a SIC liner 2. The same mechanism may work for the injector 17 however for injectors 17 it may be the case that the injector may be breaking if too much material with different thermal expansion is deposited. It may therefore be advantageously to manufacture the injector 17 from silicon carbide or silicon.

TABLE 1

Coefficient of Thermal Expansion (CTE) of Materials in Semiconductor Processing

| Material | Thermal expansion (ppm/K) |
|---|---|
| Quartz | 0.59 |
| Silicon nitride | 3 |
| Silicon | 2.3 |
| Silicon carbide | 4.0 |
| Tungsten | 4.5 |

Whether a material is suitable for the liner 2 and or the injector 17 may be dependent on the material that is deposited. It is therefore advantageously to be able to use material with substantially the same thermal expansion for the deposited material as for the liner 2 and/or the injector 17. It may therefore be advantageous to be able to use material with a thermal expansion for the liner 2 and/or the injector 17 relatively higher than that of quartz. For example Silicon Carbide SiC may be used. The silicon carbide liner may be between 4 to 6, preferably 5 mm thick since it doesn't have to compensate for atmospheric pressure. Pressure compensation may be done with the tube.

For systems depositing metal and metal compound materials with a CTE between about $4 \times 10\text{-}6$ K-1 and $6 \times 10\text{-}6$ K-1, such as TaN, HfO2 and TaO5, the liner and injector materials preferably may have a CTE between about $4 \times 10\text{-}6$ K-1 and $9 \times 10\text{-}6$ K-1, including, e.g., silicon carbide.

For deposition of material with even a higher CTE, the liner and/or injector materials may be chosen as for example depicted by table 2.

TABLE 2

Coefficient of Thermal Expansion (CTE) of Ceramic Construction Materials

| Material | Thermal expansion (ppm/K) |
|---|---|
| Macor | 12.6 |
| Boron Nitride | 11.9 |

TABLE 2-continued

Coefficient of Thermal Expansion (CTE)
of Ceramic Construction Materials

| Material | Thermal expansion (ppm/K) |
|---|---|
| Glass, ordinary | 9 |
| Mullite | 5.4 |

Within the tube 12, a purge gas inlet 19 may be provided for providing a purge gas P to the circumferential space S between an outer surface of the liner 2b and the process tube 12. The purge gas inlet comprises a purge gas injector 20 extending vertically along the outer surface of the cylindrical wall of the liner 2 from the flange 3 towards the top end of the liner. The purge gas P to the circumferential space S may create a flow in the gas exhaust openings 8 and counteract diffusion of reaction gas from the exhaust tube 7 to the circumferential space S.

The flange 3 may have an upper surface. The liner 2 may be supported by support members 4 that may be connected to the outer cylindrical surface of the liner wall 2a and each have a downwardly directed supporting surface. The liner may also be supported directly on the upper surface of the flange 3 with it lower surface 2c.

The supporting surfaces of the support members 4 may be positioned radially outwardly from the inner cylindrical surface 2b of the liner 2. In this example, the supporting surfaces of the supporting members 4 may be also positioned radially outwardly from the outer cylindrical surface 2a of the liner 2 to which they are attached. The downwardly directed supporting surface of the support members 4 may be in contact with the upper surface of the flange 3 and support the liner 2.

The support flange 3 of the closure may include gas exhaust openings 8 to remove gas from the reaction chamber of the liner 2 and the circular spaces between the liner 2 and the low-pressure tube 12. At least some of the gas exhaust openings may be provided in the upper surface of the flange 3 radially outside of the liner 2. At least some of the gas exhaust openings may be provided near the liner opening. The gas exhaust openings 8 may be in fluid connection with a pump via exhaust duct 7 for withdrawing gas from the reaction chamber and the circumferential space between the process tube 12 and the liner 2.

Figure 2:
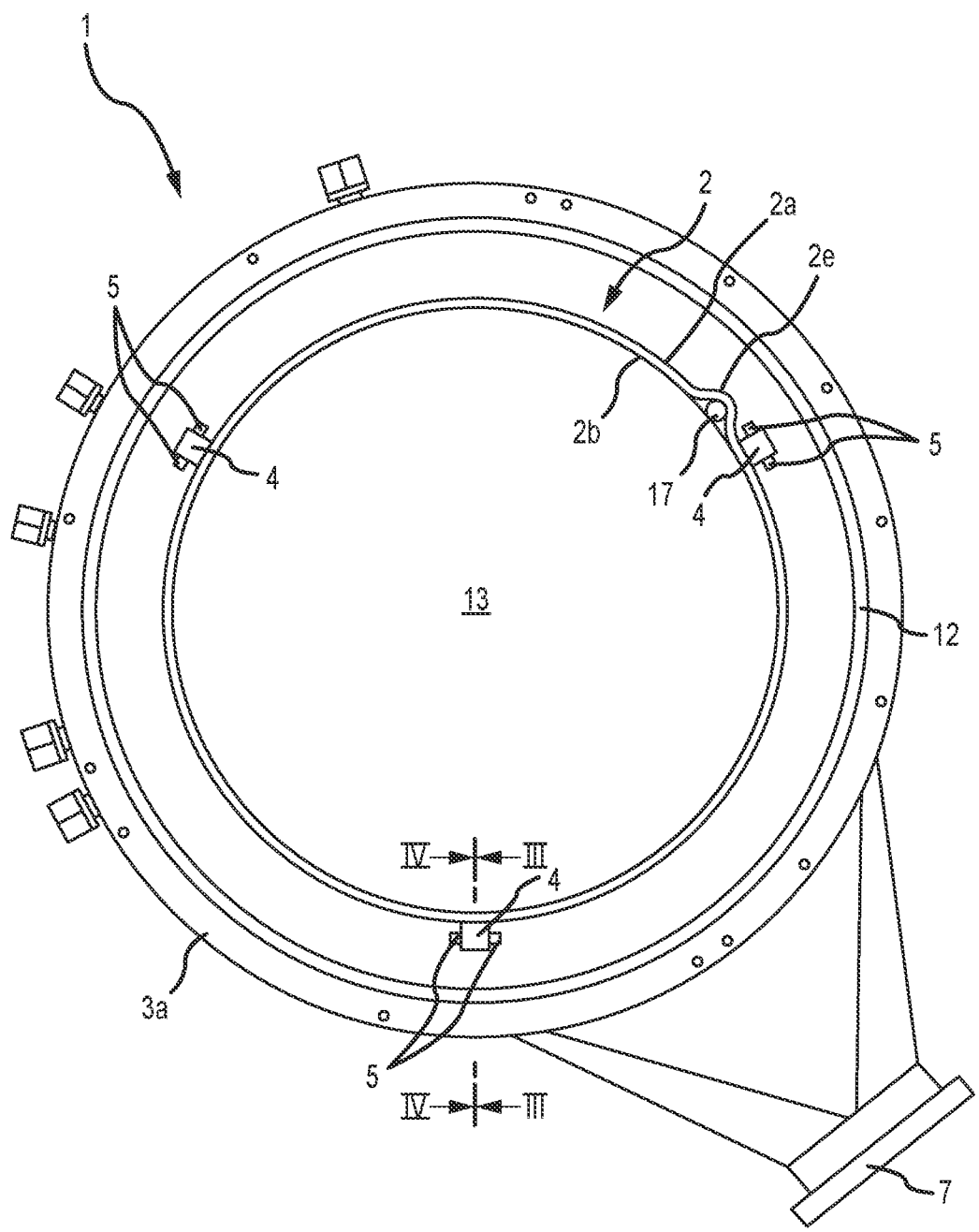
FIG. 2 is a schematic top view of the tube of FIG. 1.

FIG. 2 is a schematic top view of the tube of FIG. 1. The figure shows the liner 2 with the cylindrical wall defining an inner substantially cylindrical surface 2b and an outer substantially cylindrical surface 2a that form an opening 13 for inserting a boat configured to carry substrates.

Also visible are the support members 4. In this example, the liner 2 has three support members 4 that are equally spaced along the circumference of the outer cylindrical surface 2a of the liner 2. The flange may be provided with positioning projections 5 that extend upwards from the upper surface 3a of the flange. The positioning projections 5 may engage the support members 4 on a tangential end surface thereof. As a result, the positioning projections 5 have a centering function for the liner 2 relative to the support flange 3.

The liner 2 and the notches forming the support members 4 may be manufactured from quartz, silicon or silicon carbide. The liner 2 delimiting the reaction chamber may have a radially outwardly extending bulge 2e to accommodate the injector 17 or a temperature measurement system in the reaction chamber.

Figure 3:
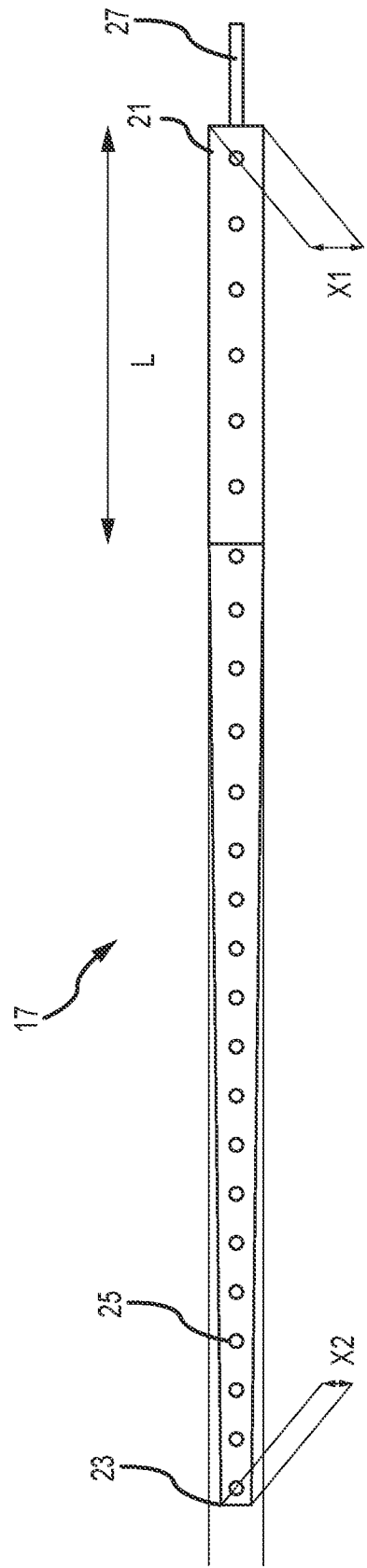
FIG. 3 is an injector according to an embodiment for use in the vertical furnace of FIG. 1.

FIG. 3 may show an injector 17 according to an embodiment for use in the vertical furnace of FIGS. 1 and 2. The injector 17 may be configured for arrangement within a reactor of a vertical furnace to inject gas in the reaction chamber I. The injector 17 may be substantially elongated and configured with an internal gas conduction channel to transport gas from a first end 21 of the injector to a second end 23 of the injector 17. Since the injector 17 may be supported at its first end 21 by the flange 3, the injector 17 may wiggle a little bit at its second end 23, because it is a very long and thin structure. It is therefore necessary to design the liner 2, injector 17 and the wafer boat B so that there is enough space between the three.

An outer side wall of the injector 17 may be tapered towards the second end of the injector over at least 10%, preferably 30%, more preferably 50%, and even more preferable over 100% of its length. By having the injector 17 tapered at the second end 23 it may occupy less space in the small space between the liner 2 and the wafer boat in the reaction chamber I near its second end 23 where the tolerances are the most tight. The tolerances at which the injector 17 with its tapered second end 23 may be positioned in the small space may therefore be a bit more relaxed. Also in vertical furnaces where no liner 2 is used an injector 17 with a tapered shape at its second end 23 may be useful in relaxing the tolerances of positioning the injector in between the tube and the boat. Dimensions of injector 17 can vary according to application. By way of example, a length (L) of injector 17 that is not tapered can be about 0 mm to about 400 mm. A cross-sectional dimension at first end 21 (X1) can be about 40 mm by about 18 mm, with a wall thickness of about 3.5-4.5 mm. A cross-sectional dimension at second end 23 (X2) can be about 38 mm by about 16 mm, with a wall thickness of about 3-4 mm.

The injector 17 may be provided with a series of openings 25 extending in the elongated direction along the injector 17 to transport gas out of the conduction channel into the reaction chamber I. As depicted the openings 25 may be substantially round. The series of openings 25 may be aligned along a line over the surface of the injector 17.

The openings 25 may be configured such that gas is injected in at least two different directions substantially perpendicular to the elongated direction of the injector so as to improve mixing of the process gas in the reaction chamber I. The series of openings 25 may therefore be aligned along at least two lines over the surface of the injector 17. Whereas a first line with openings may be shown in FIG. 3 a similar second line with openings 25 may be configured on the other side of the injector 17. The series of openings 25 along a first line may be configured such that gas is injected in a first direction and the series of openings 25 along a second line may be configured such that gas is injected in a second direction. The first and second direction may be under an angle between 30 to 180 degrees with each other.

Openings 25 may be provided pair-wise at the same height. Alternatively, the openings 25 may be provided pair-wise at unequal height to improve the strength of the injector 17. The two openings may inject the gas in two directions, for example under an angle of about 90 degrees, to improve the radial uniformity.

The distance between the openings 25 of the series of openings may be constant when going from the first end 21 to the second end 23 of the injector 17 as depicted in FIG. 3. Advantageously each opening 25 may have a substantial equal flow of process gas through the opening 25. To compensate for pressure loss when passing openings 25 when the process gas is flowing through the internal channel from the first end 21 towards the second end 23 the area of the internal channel may be increased when processing gas is transported from the first end 21 to the second end 23.

The distance between the openings 25 of the series of openings may also be designed such that it decreases when going from the first end 21 to the second end 23 of the injector 17. The later may be beneficial to compensate for pressure loss when the processing gas is transported from the first end 21 to the second end 23.

The diameter of the openings 25 may be between 1 to 15 mm, preferably between 3 to 12 mm, more preferably between 4 and 10 mm. The area of the openings may be between 1 to 200 $mm^2$, preferably between 7 to 100 $mm^2$, more preferably between 13 and 80 $mm^2$. Larger openings may have the advantage that it takes longer for the openings to clog because of deposited layers within the openings.

The vertical distance between the openings may decrease when going from the first end 21 to the second end 23 of the injector 17. The number of openings 25 may be between 2 and 40, preferably 3 and 30, and more preferably 4 and 10.

The opening 25 of the gas injector 17 may be configured to reduce clogging of the opening. The opening may have a concave shape from the inside to the outside. The concave shape with the surface area of the opening on a surface on the inside of the injector larger than the surface area of the opening 18 on the outside of the injector may reduce clogging. The larger area on the inside allows more deposition at the inner side where the pressure and therefore the deposition is larger. On the outside the pressure is reduced and therefore the deposition is also slower, and a smaller area may collect the same deposition as a larger diameter on the inside.

Reducing the pressure with the injector may result in a reduction of the reaction rate within the injector 17, because the reaction rate typically increases with increasing pressure. An additional advantage of a low pressure inside the injector is that gas volume through the injector expands at low pressure and for a constant flow of source gas the residence time of the source gas inside the injector reduces correspondingly. Because of the combination of both, the decomposition of the source gases may be reduced and thereby deposition within the injector may be reduced as well.

The process gas that may be injected via the injector 17 in the reaction chamber I to deposit layers on the wafers W in the wafer boat B may also deposit on the internal gas conduction channel or on the outer surface of the injector 17. This deposition may cause tensile or compressive stress in the injector 17. This stress may cause the injector 17 to break which causes down time of the vertical furnace and/or damage to the wafers W. Less deposition within the injector therefore may prolong the lifetime of the injector 17 and make the vertical furnace more economical.

Temperature changes of the injector 17 may even increase these stresses. To alleviate the stress the injector may be made from a material which may have the coefficient of thermal expansion of the material deposited with the process gas. For example, the gas injector may be made from silicon nitride if silicon nitride is deposited, from silicon if silicon is deposited or from silicon oxide when silicon oxide is deposited by the process gas. The thermal expansion of the deposited layer within the injector may therefore better match the thermal expansion of the injector, decreasing the chance that the gas injector may break during changes of temperature.

Silicon carbide may also be a suitable material for the injector 17. Silicon carbide has a thermal expansion which may match many deposited materials.

A disadvantage of a low pressure inside the injector is that the conduction of the injector decreases significantly. This would lead to a poor distribution of the flow of source gas over the opening pattern over the length of the injector: the majority of source gas will flow out of the holes near the inlet end of the injector. To facilitate the flow of process gas inside the injector, along the length direction of the injector, the injector may be provided with an internal gas conduction channel with a large inner cross section. In order to be able to accommodate the injector according to the invention inside the reaction chamber, the tangential size of the injector 17 may be larger than the radial size and the liner 2 may be provided with an outwardly extending bulge to accommodate the injector.

In an embodiment the two source gases, providing the two constituting elements of the binary film, are mixed in the gas supply system prior to entering the injector. This is the easiest way to ensure a homogeneous composition of the injected gas over the length of the boat. However, this is not essential. Alternatively, the two different source gases can be injected via separate injectors and mixed after injection in the reaction chamber.

The use of two injector branches allows some tuning possibilities. When gas of substantially the same composition is supplied to both parts of the injector, via separate source gas supply, the flows supplied to the different injector branches can be chosen different to fine-tune the uniformity in deposition rate over the boat. It is also possible to supply gas of different composition to the two lines of the injector to fine-tune the composition of the binary film over the boat. However, the best results may be achieved when the composition of the injected gas was the same for both injector lines.

The inner cross-sectional area of the internal gas conduction channel inside the injector 17 may be between 100 and 1500 $mm^2$, preferably between 200 and 1200 $mm^2$ and more preferably between 300 and 1000 $mm^2$. The area is chosen such that sufficient processing gas can be transported through the internal gas conduction channel even if a layer is deposited on the injector by the processing gas.

The injector 17 may also comprise one single opening near the second end of the injector to transport gas out of the conduction channel into the reaction chamber. This configuration may be called a dump injector.

The injector 17 may comprise multiple branches, for example two branches, each provided with a separate gas feed conduit connection. One branch may inject process gas into the lower part of the reaction chamber and the other branch injects process gas into the upper part of the reaction chamber. The branches may be connected by connecting parts. However, it is not essential for the invention that the injector comprises two or more injector branches. The branches may be partially tapered at their second end.

The injector 17 may be manufactured from Ceramics. The ceramics may be selected from siliconcarbide (SiC), siliconoxide (SiOx), silicon, or aluminumoxide (AlOx). The injectors may be manufactured in a process in which first the injector is formed and secondly the injector is baked to harden the ceramics.

Preceramic polymers may be used as precursors which may form the ceramic product through pyrolysis at temperatures in the range 1000-1100° C. Precursor materials to obtain silicon carbide in such a manner may include polycarbosilanes, poly(methylsilyne) and polysilazanes. Silicon carbide materials obtained through the pyrolysis of preceramic polymers may be known as polymer derived ceramics or PDCs. Pyrolysis of preceramic polymers is most often conducted under an inert atmosphere at relatively low temperatures. The pyrolysis method is advantageous because the polymer can be formed into various shapes prior to pyrolysis into the ceramic siliconcarbide. Prior to pyrolysis the material is much softer and therefore easier to be shaped in a form.

The injector 17 may comprise a bottom portion connected to a top portion wherein the top portion may be slightly tapered and ends at the second end 23. The bottom portion may be between 30 and 40 cm long starting from the first end 21 and may be substantially straight. The bottom portion may be provided with a connection pipe 27. The connection pipe 27 may be fitted in a hole in the flange 3 (in FIG. 1) to position and hold the injector 17. Such a construction on the first end 21 of the injector may be advantageously if the injector is heated because it allows for expansion of the injector 17. A disadvantage may be that it allows for some wiggling of the injector 17 especially at the second end 23. By having the second end 23 tapered the tolerance for wiggling of the injector 17 may be increased.

The top portion may have a cross sectional area at the second end 23 that is 1 to 80%, preferably 3 to 40%, and most preferably 4 to 20% smaller than the cross sectional area at the first end. The top portion may have a wall thickness at the second end that is 2 to 50%, preferably 5 to 30% and most preferably 10 to 20% than the wall thickness at the first end 21.

The injector 17 may have a cross sectional area at the second end that is 1 to 80%, preferably 3 to 40%, and most preferably 4 to 20% smaller than the cross sectional area at the first end. The injector may have a wall thickness at the second end 23 that is 2 to 50%, preferably 5 to 30% and most preferably 10 to 20% smaller than the wall thickness at the first end 21.

A vertical furnace according to an embodiment may comprise:
a (low pressure) process tube provided with an opening with a closeable door to from a reaction chamber;
a heater configured to heat the reaction chamber of the process tube; and,
a wafer boat that is configured to move substrates in the reaction chamber in a vertical direction. An injector may be provided in the reaction chamber which may be supported at its first end near the opening and is directed with its elongated tapered second end extending along the vertical direction into the reactions chamber.

The vertical furnace may comprise a flange 3 partially closing the open end of the process tube, leaving a central inlet opening open for the wafer boat to move in and closeable by the door. The vertically movably arranged door configured to close off the central inlet opening in the flange 3 and configured to support a wafer boat that is configured to hold substrates. The vertical furnace may be provided with a liner provided along the inside surface of the process tube. The liner may be provided with a bulge creating space on the inside of the liner for the injector 17.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another.

What is claimed is:

1. An injector configured for arrangement within a reaction chamber of a vertical furnace to inject gas in the reaction chamber, the injector is:
substantially elongated and configured to transport gas through an internal gas conduction channel from a first end of the injector to a second end of the injector, wherein the first end and the second end are on opposite ends of a length of the injector, wherein an outer side wall of the injector is tapered towards the second end of the injector over at least 10% of the length such that a cross sectional area at the second end is 3 to 40% smaller than a cross sectional area at the first end, and wherein the outer side wall is substantially straight along a bottom portion extending from the first end and tapers along a top portion extending from the bottom portion to the second end, and
wherein the injector is provided with a series of openings extending in the elongated direction along the length of the injector to transport gas out of the internal gas conduction channel into the reaction chamber, wherein a portion of the series of openings are provided in the bottom portion of the injector.

2. The injector according to claim 1, wherein the openings are configured such that gas is injected in two different directions, wherein the angle between the two different directions is about 90 degrees.

3. The injector according to claim 1, wherein the openings are configured such that gas is injected in two different directions, and wherein the openings are provided pair-wise at unequal lengths along the length of the injector.

4. The injector according to claim 1, wherein the distance between the openings of the series of openings decreases when going from the first end to the second end of the injector.

5. The injector according to claim 4, wherein the openings are configured such that gas is injected in at least two different directions substantially perpendicular to the elongated direction of the injector, and wherein the openings are provided pair-wise at unequal lengths along the length of the injector.

6. The injector according to claim 1, wherein the at least one opening has a concave shape from the inside to the outside of the injector.

7. The injector according to claim 1, wherein the inner cross-sectional area of the internal gas conduction channel inside the injector is between 300 and 1000 mm$^2$.

8. The injector according to claim 1, wherein the injector comprises one single opening at the second end of the injector to transport gas out of the internal gas conduction channel into the reaction chamber.

9. The injector according to claim 1, wherein the injector is manufactured from ceramics.

10. The injector according to claim 9 wherein the ceramics are selected from siliconcarbide (SiC), siliconoxide (SiOx), Silicon, or aluminiumoxide (AlOx).

11. The injector according to claim 1, wherein the bottom portion is 30 to 40 cm long starting from the first end.

12. The injector according to claim 1, wherein the injector has a cross sectional area at the second end that is 4 to 20% smaller than the cross sectional area at the first end.

13. The injector according to claim 1, wherein the injector has a wall thickness from the outer side wall of the injector to the internal conduction channel at the second end that is 2 to 50% smaller than the wall thickness from the outer side wall of the injector to the internal conduction channel at the first end.

14. A vertical furnace comprising:
a process tube provided with an opening with a closeable door to form a reaction chamber;
a heater configured to heat the reaction chamber of the process tube; and,
a wafer boat that is configured to move substrates in the reaction chamber in a vertical direction,
wherein an injector is provided in the reaction chamber, wherein the injector is substantially elongated and configured to transport gas through an internal gas conduction channel from a first end of the injector to a second end of the injector, wherein the first end and the second end are on opposite ends of a length of the injector, wherein an outer side wall of the injector is tapered towards the second end of the injector over at least 10% of the length such that a cross sectional area at the second end is 3 to 40% smaller than a cross sectional area at the first end, and wherein the outer side wall is substantially straight along a bottom portion extending from the first end and tapers along a top portion extending from the bottom portion to the second end,
wherein the injector is provided with a series of openings extending in the elongated direction along the length of the injector to transport gas out of the internal gas conduction channel into the reaction chamber, wherein a portion of the series of openings are provided in the bottom portion of the injector and,
wherein the injector is supported at the first end near the opening and is directed with the second end extending along the vertical direction into the reaction chamber.

15. The vertical furnace according to claim 14, wherein a liner is provided along the inside surface of the process tube.

16. The vertical furnace according to claim 15, wherein the liner is provided with a bulge creating space on the inside of the liner for the injector.

17. The injector according to claim 1, further comprising a connection pipe connected to the first end.

18. The injector according to claim 1, wherein the injector has a wall thickness from the outer side wall of the injector to the internal conduction channel at the second end that is 10 to 20% smaller than the wall thickness from the outer side wall of the injector to the internal conduction channel at the first end.

19. The injector according to claim 12, wherein the injector has a wall thickness from the outer side wall of the injector to the internal conduction channel at the second end that is 10 to 20% smaller than the wall thickness from the outer side wall of the injector to the internal conduction channel at the first end.

* * * * *